United States Patent [19]

Kiyota et al.

[11] Patent Number: 4,547,279
[45] Date of Patent: Oct. 15, 1985

[54] SPUTTERING APPARATUS

[75] Inventors: Hideharu Kiyota, Tokyo; Mitsuaki Horiuchi, Fuchu, both of Japan

[73] Assignee: Hitachi, Ltd., Tokyo, Japan

[21] Appl. No.: 673,928

[22] Filed: Nov. 21, 1984

Related U.S. Application Data

[63] Continuation of Ser. No. 544,729, Oct. 24, 1983, abandoned.

[30] Foreign Application Priority Data

Oct. 22, 1982 [JP] Japan ................................. 57-184577

[51] Int. Cl.[4] .............................................. C23C 15/00
[52] U.S. Cl. .................................. 204/298; 204/192 R
[58] Field of Search ............................ 204/298, 192 R

[56] References Cited

U.S. PATENT DOCUMENTS

| | | | |
|---|---|---|---|
| 4,060,470 | 11/1977 | Clarke | 204/298 |
| 4,169,031 | 9/1979 | Brors | 204/298 |
| 4,219,397 | 8/1980 | Clarke | 204/298 |
| 4,401,539 | 8/1983 | Abe et al. | 204/298 |
| 4,414,086 | 11/1983 | Lamont | 204/298 |
| 4,422,896 | 12/1983 | Class et al. | 204/298 |
| 4,428,816 | 1/1984 | Class et al. | 204/298 |
| 4,457,825 | 7/1984 | Lamont | 204/298 |

FOREIGN PATENT DOCUMENTS

| | | |
|---|---|---|
| 2513216 | 11/1975 | Fed. Rep. of Germany . |
| 2824289 | 12/1978 | Fed. Rep. of Germany . |
| 3004546 | 8/1980 | Fed. Rep. of Germany . |
| 2058143 | 4/1981 | United Kingdom . |
| 2078787 | 1/1982 | United Kingdom . |

Primary Examiner—Arthur P. Demers
Attorney, Agent, or Firm—Antonelli, Terry & Wands

[57] ABSTRACT

A magnetron type sputter apparatus utilizing an orthogonal electromagnetic field, with the apparatus being adapted for forming an electrode wiring of a semiconductor device. The apparatus includes a target having a shape adapted to prevent a bumping of a target material from an end part of the target so that a temperature rise and damage of the semiconductor device attributed to electron bombardment can be prevented and the lifetime of the target can be prolonged.

28 Claims, 6 Drawing Figures

4,547,279

SPUTTERING APPARATUS

This is a continuation of application Ser. No. 544,729 filed Oct. 24, 1983, now abandoned.

BACKGROUND OF THE INVENTION

The present invention relates to a sputtering apparatus and, more particularly, to a magnetron type sputtering apparatus which is adapted to prevent inferior sputtering attributable to bumping or sudden boiling.

In order to enhance the performance of semi-conductor devices, P-N junctions of the semiconductor devices have become shallower and patterns have become finer. Additionally, it has become necessary to adopt aluminum alloy materials such as, for example, Al-Si and Al-Si-Cu, and high melting metal materials such as, for example, Mo, W, and Pt as electrode wiring materials. However, such materials are difficult to treat with conventional vacuum evaporators.

Previously, sputtering apparatus have been principally utilized for thin-film ICs and such apparatus are difficult to apply to the formation of electrodes of semiconductor devices since, for example, the deposition rate is relatively low and there is a rise in the substrate temperature resulting in a damaging of the semiconductor device.

However, in an attempt to solve the above-noted problems, in recent years, a magnetron type sputtering apparatus has been developed which utilizes an orthogonal electromagnetic el field. Magnetron type sputtering apparatus have been put into practical use in electrode wiring steps of semiconductor devices.

A magnetron type sputtering apparatus may be classified into various types depending upon the arrangements of the magnets and the shapes of the targets. However, any magnetron type sputtering apparatus is based upon the principal that a plasma moving in conformity with the Lorentz equation is confined into a local space in a vicinity of a target by utilizing an orthogonal electromagnetic field. More particularly, electrons execute a cycloid motion on the target and collide against gas molecules resulting in a generation of plasma of a high density. Since the electrons are constrained by the magnetic field, it is possible to prevent a temperature increase and damage to the semiconductor device due to the bombardment of the wafer with electrons.

Generally, a magnetron type sputtering apparatus is constructed so that, in a vicinity of a target or cathode, disposed in opposition to an anode, magnets (permanent magnets or electromagnets) are disposed to form the electromagnetic field near the target, with the plasma being confined on the target by utilizing the cycloid motion of the electrons in order to obtain a high sputtering rate.

An extensively used sputtering apparatus known as a "Sputter System 3125H", manufactured by Varian, Inc, is based on the principle that argon gas, introduced in a vacuum chamber of the apparatus, is ionized and a target or film material is struck by the ions. A ring magnetron or a S-GUN, is employed for ionizing the argon and accelerating the ions, with the S-GUN forming a plasma discharge having a doughnut-shape. The plasma discharge is established by an electric field and a magnetic field, and the argon molecules are ionized and the target is bombarded with the ions by the plasma discharge. Since the plasma is formed in a doughnut shape just on the target, most of the secondary electrons are confined within the plasma.

In the above-noted system, the S-GUN is incorporated into a chamber with the system also including a planetary type substrate jig and a rotating mechanism, along with a liquid nitrogen cold trap, a diffusion pump, an ion gauge, a main valve, a variable orifice for regulating the argon gas, and a substrate heater.

In use, a substrate is set on a member of the planetary type substrate jig and, for example, up to three members may be put in the chamber. The chamber is then closed or sealed by a door and a preliminary evacuation is begun, with the evacuation being effected by a mechanical pump. Subsequently, the diffusion pump is actuated to begin a main evacuation of the chamber. The members of the planetary type substrate jig revolve around the S-GUN while revolving around their own axes and, when a degree of vacuum of the order to $10^{-6}$ Torr has been reached, the heater in the chamber may be turned "on" to attain a set temperature. After a thermal equilibrium has been reached, a RF etching is performed; however, the heating and etching processes are optional. Thereafter, the argon gas is introduced, and the argon gas is maintained in the chamber at a pressure of up to the order to $10^{-3}$ Torr, whereupon the sputtering begins.

In the above noted system, since a distance from the S-GUN to the substrate is about 50 cm, the influence of the secondary electrons is substantially avoided and a favorable uniformity and step coverage are attained by a good angle of incidence at which the target molecules are deposited on the substrate. Furthermore, the jig of the substrates revolves on its own axis and also around the S-GUN so as to further improve the uniformity and step coverage. When the deposition on the substrate has ended, dry nitrogen is introduced to restore the interior of the chamber to atmospheric pressure thereby terminating one cycle of operation.

SUMMARY OF THE INVENTION

The aim underlying the present invention essentially resides in providing a sputtering apparatus which prevents a bumping or sudden boiling of a target material from a marginal area of the target.

Another object of the present invention resides in providing a sputtering apparatus which minimizes if not avoids a generation of a spark between a marginal end of the target and a shield ring.

Yet another object of the present invention resides in providing a sputtering apparatus which considerably lengthens a useful lifetime of the target.

A still further object of the present invention resides in providing a sputtering apparatus which avoids any appearance of splattering.

Yet another object of the present invention resides in providing a sputtering apparatus which enables an efficient fabrication of semiconductor devices and which reduces the number of defective semiconductor devices produced as well as the overall production costs.

In accordance with advantageous features of the present invention, a sputtering apparatus is provided which includes an anode, a target as a cathode arranged in opposition to the anode, along with magnets and a shield ring which are disposed in positions near the target. An end portion of the target on a side nearer to the shield ring is formed so as to be flat.

Advantageously, in accordance with further features of the present invention, the magnets and shield ring are arranged around the target, and an edge of an outer peripheral end part of the target is formed flat.

With an annular target, in accordance with the present invention, a section of the target is substantially in the shape of a right angled triangle and an upper end part thereof is formed flat.

These and other objects, features, and advantages of the present invention will become more apparent from the following description when taken in connection with the accompanying drawings which show, for the purpose of illustration only, several embodiments in accordance with the present invention:

DETAILED DESCRIPTION

Figure 1:
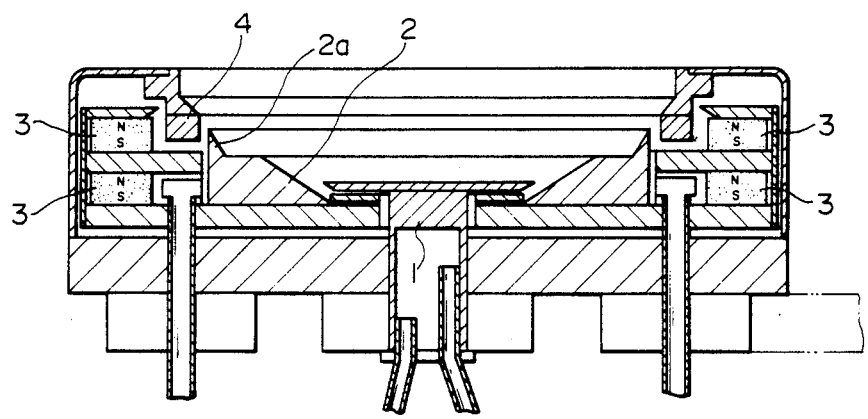
FIG. 1 is a cross sectional view of a sputter gun portion of a prior art sputtering apparatus.
Figure 2:
FIG. 2 is a cross sectional view, partially broken away, of a target of the sputtering apparatus of FIG. 1.

Referring now to the drawings wherein like reference numerals are used throughout the various views to designate like parts and, more particularly, to FIGS. 1 and 2, according to these figures, a sputter apparatus corresponding to the above noted "Sputter System 3125H" includes an aluminum annular target 2 forming a cathode, disposed around a centrally located anode 1, with the target being supplied with a −500 to −600V and the anode 1 having an applied voltage of a +24V. Permanent magnets or electromagnets 3 are disposed around the target 2 so as to form an orthogonal electromagnetic field on the target 1, with a grounded shield ring being interposed between the magnets 3 and the target 2.

Electrons, emitted by a glow discharge rising between the anode 1 and target 2, execute a cycloid motion due to the orthogonal electromagnetic field, and a plasma, generated by raising the density of collisions thereof, is confined to the target 2. In this manner, Al atoms, which are generated or sputtered by the collisions of the positive ions in the plasma against a target 2, are quickly generated so that an enhancement in the disposition rate of Al on the wafer or substrate and an enhancement in the purity thereof can be realized.

In the sputtering apparatus of FIGS. 1 and 2, the Al atoms sputtered from the target 2 are deposited on the wafer (not shown) and are also scattered toward the magnets 3 around the target, with the atoms tending to adhere thereto. A shield ring 4 is disposed between the target 2 and the magnets 3 so as to prevent a deposition of the Al atoms on the magnets 3. However, the Al atoms are deposited on the surface of the shield ring 4 and the minute gaps thereof. When a large quantity of Al is deposited, the orthogonal electromagnetic field formed by the magnets 3 is affected and the orthogonal electromagnetic field becomes incapable of holding its initial state due to the deterioration of the permanent magnets attributed to changes. For these reasons the cycloid motion of the electrons fluctuates and an end portion of the target 2 near the outer periphery thereof becomes sputtered.

Consequently, the margin or end portion of the target becomes somewhat roughened upon the occurrence of the sputtering. In particular a margin 2a, in the shape of an edge, is formed with a large number of roughened parts on its surface. Therefore, an electric field concentration may arise at the margin 2a and sparks are likely to appear between the margin 2a and the proximate shield ring 4 which is held at a ground potential. When the electric field concentration exceeds a predetermined limit, a spark arises and a bumping or sudden boiling takes place from the target margin 2a due to the impact of the spark. When a bumped Al atom adheres to the wafer surface, the Al bulges or splatters thereby resulting in a wiring short circuit developing.

Consequently, with a prior art system employing a target 2 with a marginal area 2a which becomes roughened, it is necessary to exchange the target quite frequently and, the short lifetime of the target 2 can result in problems such as a low available precentage of semiconductor devices as well as a high cost of the target.

Figure 3:
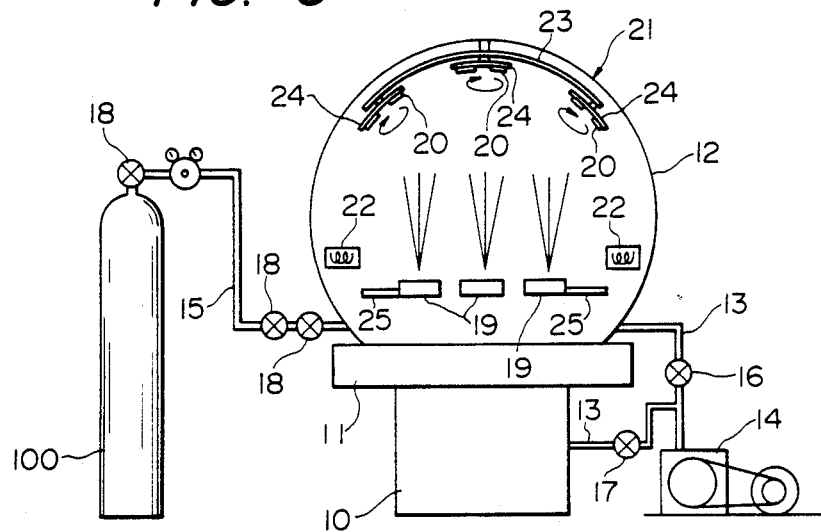
FIG. 3 is a partially schematic view of a sputtering apparatus constructed in accordance with the present invention.

As shown in FIG. 3, in accordance with the present invention, a substantially spherical or global vacuum chamber 12 and chiller 11 are mounted on a base 10, with a diffusion pump (not shown) being disposed in the base 10 for evacuating an interior of the vacuum chamber 12 to, for example, a high vacuum of, for example, $10^{-7}$ Torr. A rotary mechanical pump 14 communicates with the base 10 through a pipe 13, and an argon (Ar) gas source 100 is connected to the chamber 12 through a tube 15 so that argon gas can be introduced into the chamber 12, with valves 16, 17, 18 being provided for controlling the communication between the pump 14, gas source 100, and chamber 12.

A plurality of sputter guns 19, for example, three, in the illustrated embodiment, are disposed within the vacuum chamber 12, and wafers 20, representing objects to be processed, are supported at an upper part of the chamber by a planetary arrangement generally designated by the reference numeral 21, with heaters 22 being arranged near the sputter guns 19. The planetary arrangement 21 includes a rotary plate 23 which revolves or rotates about its center axis, with a plurality of individual rotary plates 24 being mounted at a periphery of the rotary plate which revolve around their respective center axes. The plurality of wafers 20 are supported on a surface of each of the rotary plates 24 as the rotary plates are rotated around their center axes and, consequently, a planetary rotary motion results wherein the planetary rotary plate 24 revolves along its own center axis while revolving around the rotary plate 23.

Figure 4:
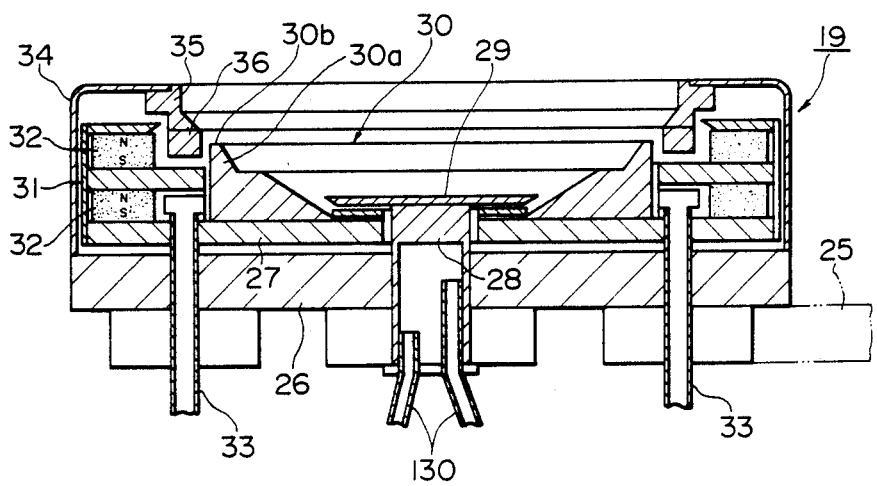
FIG. 4 is a cross sectional view, on an enlarged scale, of a sputter gun of the sputtering apparatus of the present invention.

As shown in FIG. 4, the sputter gun 19 includes a disc-like shield base 26 which is cantilievered in the chamber 12 by an arm 25. A base plate 27 is disposed over the shield base 26 and is supported in an insulated manner. An anode 28 extends through a central portion of the shield base 26 and base plate 27 and is supported so as to be insulated from the shield base 26 and base plate 27. An anode disc is secured to an upper end of the anode 28, and a coolant pipe 130 is provided for supplying, for example, water to a hollow lower part of the anode 28. An electric connection is made so as to apply about a +24 V to the anode 28. An annular target, generally designated by the reference numeral 30, is disposed on the base plate 27 surrounding the anode 28. Magnets 32 such as, for example, permanent magnets are disposed around the target 30 by a bracket 31. The target 30 is fashioned of a silicon material containing 2% of aluminum.

Figure 5:
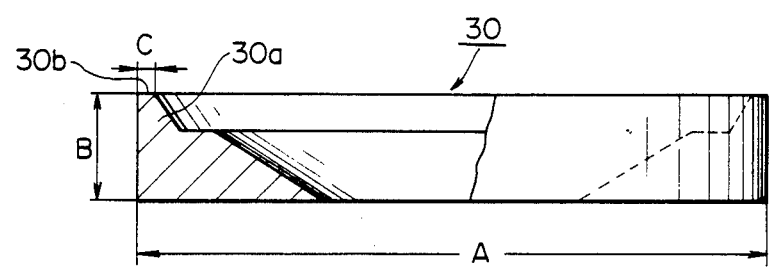
FIG. 5 is a cross sectional view, partially broken away, of a target constructed in accordance with the present invention.

As shown most clearly in FIG. 5, the target 30 has a sectional shape of a right angle triangle, with an oblique line being formed with a step. Preferably, the target 30 has an outside diameter A of 131.0 mm and a height B of 22.4 mm. An end part 30a at the outermost and highest position of the target 30 is constructed so that its upper edge 30b defines a flat surface. A width C of the upper edge 30b is preferably equal to 2.0±0.5 mm. The target 30 is constructed as a cathode by applying a voltage of a −500−−600 V thereto through the base plate 27 and the magnets 32 are such that a plurality of magnets are circumferentially arrayed in two stages, namely, upper and lower stages. The magnets 30 along with an electric field established by the voltage on the target 30 form an orthogonal electromagnetic field on the target 30 in the vicinity of the inner slant surface. A coolant pipe 33 is connected to the bracket 31 supporting the magnets 32 for supplying, for example, cooling water.

As shown in FIG. 4, a shield wall 34, having a substantially L-shaped cross section, is mounted on the outer periphery of the shield base 26 so as to surround the magnets 32, and a sputter shield ring 35 is fixed to an inner edge of the shield wall 34 so as to enable the shield ring 35 to extend in a downward direction. A shield ring 36 is integrally mounted on a lower surface of the sputter shield ring 35 so as to intervene or be interposed between the target 30 and the magnets 32. The shield ring 35 and 36, etc are grounded through the shield wall 34 and the shield base 26 and are thus held at a ground potential (0 V).

The sputtering apparatus of the present invention operates in the following manner:

First wafers 20 are set on the planetary arrangement 21, while the target 30, of a material to be sputtered, for example, Al containing 2% of Si, is set on each base plate 27. In this condition, the diffusion pump, the pump 14, etc are operated to bring the interior of the vacuum chamber 12 to a vacuum pressure of about $10^{-7}$ Torr and the required voltages are applied to the anode 28 and the target 30. Argon gas is introduced into the chamber 12 to set the interior thereof at $10^{-3}$ Torr and a plasma is generated in each sputter gun 19 to start the sputtering operation.

More particularly, when the anode 28 has a +24 V applied thereto and the target 30 has a −500−−600 V applied thereto, a glow discharge arises therebetween and then the electrons conduct a cycloid motion on the target 30 under the action of the orthogonal electromagnetic field based on the magnets 32, and the plasma generated by raising the density of collisions thereof is confined to the target 30. Therefore, the density at which the argon ions and the plasma collide against the target 30 is also increased, and the aluminum atoms are sputtered from the target 30 relatively quickly. Accordingly, the aluminum atoms fly from the sputter gun 19 to the upper part of the chamber 12 and are desposited on the surfaces of the wafers 20. By this arrangement, the deposition rate is enhanced and a high purity is obtained.

The sputtered aluminum atoms adhere, not only to the wafers 20 but also on each shield ring 36 by being scattered laterally. When the intensity of the orthogonal electromagnetic field has been lowered due to the adhesion of the aluminum atoms on the shield rings 36 and when the field changes with time, the cycloid motion fluctuates and the argon ions collide against the target 30 at the outer peripheral end part thereof so as to result in a sputtering. However, in the illustrated example, the target 30 has an end part 30a which is formed of a flat surface so that even when the end part is roughened by the sputtering, it is always held in a round shape without becoming acute. Accordingly, an electric field concentration does not occur in the end part 30a of the target 30 and a spark is not generated or does not appear between the shield ring 36 and the target 30. Consequently, the bumping of aluminum does not arise and the aluminum bulges or splatters are not formed so that no wire short circuit appears on the surface of the wafer 20.

As a result of the above features, the target 30 can continue the sputtering even when the end portion thereof is roughened. The lifetime of the target 30 is significantly increased which increases the number of semiconductor devices that can be processed without target replacement while reducing the fabrication costs of such semiconductor devices. The reason for this is that, even when the sputtering rate is raised, the period of time in which the target 30 consumes is longer than that in the prior art and, consequently, the frequency of exchange of targets is less.

With a target 30 whose end part 30a is formed as a flat surface, it is also possible for both edges of the flat surface to be rounded. Needless to say, when the dimensions of the outside diameter and the height of the target 30 differ, the width dimension C of the flat surface becomes correspondingly different and, when the material of the target 30 is something other than aluminum, the value also differs.

Figure 6:
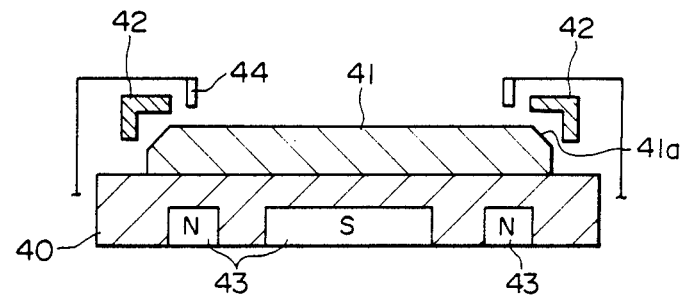
FIG. 6 is a schematic cross sectional view of another embodiment of a sputter gun constructed in accordance with the present invention.

FIG. 6 provides an example of a planar type sputtering apparatus wherein a base plate 40 has installed or mounted thereon a flat target 41 with an anode 42 being arranged around and over the target 41 and in proximity thereto. Magnets 43 such as, for example, permanent magnets or electromagnets, are embedded in the base plate 40 and form an orthogonal electromagnetic field on the target 41, with a shield ring 44 being provided.

In the sputtering apparatus of FIG. 6, electrons are caused to perform a cycloid motion on the target 41 by the glow discharge between the anode 42 and the target 41, whereupon the target 41 is bombarded with argon ions in a plasma so as to sputter aluminum atoms. Also, a peripheral end part of the target 41, especially an upper peripheral edge 41a, proximate to the anode 42, is cut and formed so as to define a flat surface. Thus, even when the end part of the target 41 has been roughened by sputtering, an electric field concentration does not arise and the appearance of a spark between the end part of the target 41 and the shield ring 44 is prevented so as to effectively prevent a bumping or sudden boiling. As a result the lifetime of the target 41 is prolonged and there is an increase in the number of semiconductor devices manufactured as well as a reduction in overall manufacturing costs.

In accordance with the features of the present invention, a sputtering apparatus is provided wherein an end part of a target 30 or 41 is formed with a flat surface 30b or 41a so that no acute angled part exists on the target. Therefore, even when the target end part is roughened by sputtering, the occurrence of an electric field concentration in the end part of the target 30 or 41 is prevented as well as the appearance of sparks so that a bumping and the attendant splatters are prevented.

While we have shown and described several embodiments in accordance with the present invention, it is understood that the same is not limited thereto but is susceptible of numerous changes and modifications as known to one having ordinary skill in the art and we therefore do not wish to be limited to the details shown and described herein, but intend to cover all such modifications as are encompassed by the scope of the appended claims.

We claim:

1. A sputtering apparatus comprising an anode, a target means arranged in opposition to said anode which is biased as a cathode, means for generating a magnetic field, and a shield disposed in proximity to said target means, said target means including a substantially flat surface at an outer marginal area thereof in proximity to said shield ring.

2. A sputtering apparatus according to claim 1, wherein said means for generating a magnetic field and said shield is arranged around said target means, wherein said substantially flat surface is formed at an edge of an outer peripheral portion of said traget means.

3. A sputtering apparatus according to claim 1, wherein said target means is formed by an annular member and has a substantially right-angle triangular cross-sectional configuration, with an upper end part of the triangle forming the substantially flat surface.

4. A sputtering apparatus comprising: an anode to which is applied a positive potential for producing an electric field having a component normal to a target;
a cathode in opposition to said anode to which is applied a negative potential which functions as the target ions to be sputtered, said target having an outer peripheral portion which is flat and which defines a non-vertically disposed outside periphery;
means disposed around the outside periphery of said target for producing a magnetic field which functions to confine electrons emitted between the anode and the target; and
a shield interposed in a space disposed between the magnets and the target.

5. A sputtering apparatus in accordance with claim 1, wherein said target is an annular member and has a cross-sectional configuration having a first inclined section, a first horizontally disposed section having a first end joined to the first inclined section and a second end, a second inclined section having a first end joined to the second end of the first horizontally disposed section and a second end and a second horizontally disposed section joined to the second end of the second inclined section, said second horizontally disposed section being said flat outer peripheral portion.

6. A sputtering apparatus comprising:
an anode to which is applied a positive potential for producing an electrical field having a component normal to a target;
a cathode to which is applied a negative potential which functions as the target to be sputtered, said target being conical, disposed around said anode and, having an interior portion which is substantially flat and a peripheral portion which defines a substantially flat non-vertically disposed surface;
means for producing a magnetic field disposed in proximity to said target which functions to confine electrons emitted between the anode and the target; and
a shield means facing said substantially flat non-vertically disposed surface means.

7. A method for depositing atoms sputtered from a target, onto one or more semiconductor wafers in which the occurrence of an electrical discharge between the peripheral portion of the target and a shield is minimized comprising:
providing the peripheral portion of the target with a substantially flat surface which lessens the concentration of an electrical field between the peripheral portion of the target and the shield during sputtering; and
depositing the atoms sputtered from the target onto one or more of the semiconductor wafers whereby the
depositing of an undesired concentration of atoms on the one or more wafers is minimized.

8. The method of claim 7 wherein said target is conical.

9. The method of claim 7 wherein said target is flat.

10. A sputtering apparatus comprising:
an anode to which is applied a positive potential for producing an electrical field having a component normal to a target;
a planar cathode opposed to said anode to which is applied a negative potential which functions as a target to be sputtered, said target having an interior portion which is substantially flat and a peripheral portion which is chamfered with respect to the horizontal to define a substantially flat peripheral surface;
means disposed in proximity to said target for producing a magnetic field which functions to confine electrons emitted between the anode and the target; and
a shield facing the peripheral surface.

11. A target for sputtering having a target surface and a flat peripheral surface inclined at an obtuse angle measured within the target with respect to the target surface of the target, the peripheral surface being adjacent to a shield ring when the target is in use.

12. A target according to claim 11, wherein the target is annular and has at least one inner surface inclined to the longitudnal axis of the target, the at least one inner surface being the target surface.

13. A target according to claim 12, wherein the peripheral surface is substantially perpendicular to the longitudinal axis of the target.

14. A target according to claim 12, wherein the peripheral surface is between the target surface and a cylindrical outer surface of the target.

15. A target according to claim 13, wherein the peripheral surface is between the target surface and a cylindrical outer surface of the target.

16. A target according to claim 11 wherein the target is planar, the target surface is a planar surface of the target, and the peripheral surface is between the target surface and a side surface of the target.

17. A sputtering process, comprising applying a voltage between an anode and a target forming a cathode, thereby to generate a glow discharge of free ions, and
guiding the free ions onto the target by a means for producing a magnetic field, thereby to generate free atoms, the free atoms travelling to a substrate, wherein there is a shield ring between the means for producing a magnetic field and the target, and the target has a target surface and a flat peripheral surface inclined at an obtuse angle measured within the target with respect to the target surface, the peripheral surface being adjacent to the shield ring when the target is in use.

18. A sputtering process in accordance with claim 17 wherein the target is annular and has at least one inner surface inclined to the longitudinal axis of the target, the at least one inner surface being the target surface.

19. A process in accordance with claim 12 wherein the peripheral surface is substantially perpendicular to the longitudinal axis of the target.

20. A sputtering process in accordance with claim 18 wherein the peripheral surface is between the target surface and a cylindrical outer surface of the target.

21. A sputtering process in accordance with claim 19 wherein the peripheral surface is between the target surface and a cylindrical outer surface of the target.

22. A sputtering process in accordance with claim 17 wherein the target is planar, the target surface is a planar surface of the target and the peripheral surface is between the target surface and a side surface of the target.

23. A sputtering apparatus having:
   a target for sputtering having a target surface and a flat peripheral surface inclined at an obtuse angle measured within the target with respect to the target surface of the target, the peripheral surface being adjacent to a shield ring when the target is in use, said target forming a cathode;
   an anode in opposition to the cathode; and
   a magnet and a shield ring located near the target such that the shield ring is adjacent the peripheral surface of the target.

24. A sputtering apparatus in accordance with claim 23 wherein the target is annular and has at least one inner surface inclined to the longitudinal axis of the target, the at least one inner surface being the target surface.

25. A sputtering apparatus in accordance with claim 24 wherein the peripheral surface is substantially perpendicular to the longitudinal axis of the target.

26. A sputtering apparatus in accordance with claim 24 wherein the peripheral surface is between the target surface and a cylindrical outer surface of the target.

27. A sputtering apparatus in accordance with claim 25 wherein the peripheral surface is between the target surface and a cylindrical outer surface of the target.

28. A sputtering apparatus in accordance with claim 23 wherein the target is planar, the target surface is a planar surface of the target and the peripheral surface is between the target surface and a side surface of the target.

* * * * *